US009433105B2

(12) United States Patent
Graf et al.

(10) Patent No.: US 9,433,105 B2
(45) Date of Patent: Aug. 30, 2016

(54) METHOD OF FABRICATING PRINTED CIRCUIT BOARDS

(75) Inventors: Richard Stephen Graf, Gray, ME (US); Thomas Edward Lombardi, Poughkeepsie, NY (US); Sudipta Kumar Ray, Wappingers Fall, NY (US); David Justin West, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 2044 days.

(21) Appl. No.: 12/547,226

(22) Filed: Aug. 25, 2009

(65) Prior Publication Data

US 2011/0048790 A1    Mar. 3, 2011

(51) Int. Cl.
*H05K 3/42* (2006.01)
*H05K 3/40* (2006.01)
*H05K 3/00* (2006.01)

(52) U.S. Cl.
CPC ............ *H05K 3/403* (2013.01); *H05K 3/0052* (2013.01); *H05K 3/42* (2013.01); *H05K 2201/10159* (2013.01); *Y10T 29/49165* (2015.01)

(58) Field of Classification Search
CPC ...... H05K 3/0052; H05K 3/403; H05K 3/42; H05K 2201/10159; Y10T 29/49165
USPC .................. 29/830, 832, 846, 852
See application file for complete search history.

(56) References Cited

U.S. PATENT DOCUMENTS

| | | | |
|---|---|---|---|
| 4,684,184 A | 8/1987 | Grabbe et al. | |
| 4,833,404 A | 5/1989 | Meyer et al. | |
| 5,204,615 A | 4/1993 | Richards et al. | |
| 5,451,721 A | 9/1995 | Tsukada et al. | |
| 5,737,191 A | 4/1998 | Horiuchi et al. | |
| 6,268,660 B1 | 7/2001 | Dhong et al. | |
| 6,664,864 B2 * | 12/2003 | Jiles et al. | 331/176 |
| 6,710,433 B2 * | 3/2004 | Megahed et al. | 257/678 |
| 6,797,891 B1 | 9/2004 | Blair et al. | |
| 6,960,824 B1 * | 11/2005 | Hashemi et al. | 257/698 |
| 7,061,096 B2 | 6/2006 | Fjelstad et al. | |
| 7,132,841 B1 | 11/2006 | Bertin et al. | |
| 7,247,516 B1 * | 7/2007 | Hashemi et al. | 438/106 |
| 7,345,359 B2 | 3/2008 | Kim et al. | |
| 7,958,629 B2 * | 6/2011 | Thompson et al. | 29/840 |
| 2008/0029897 A1 | 2/2008 | Oberle | |

* cited by examiner

*Primary Examiner* — Carl Arbes
(74) *Attorney, Agent, or Firm* — Yee & Associates, P.C.; Damion Josephs

(57) ABSTRACT

An electrically insulating substrate is provided. The electrically insulating substrate includes a set of areas to be formed into a set of printed circuit boards. Each of the set of areas is separated from others of the set of areas by a dicing channel. A set of signal wiring conductors is fabricated onto the set of areas of the electrically insulating substrate so that at least one of the set of signal wiring conductors terminates proximate to the dicing channel. A set of plated through holes is fabricated through at least one of the set of areas such that at least one of the set of plated through holes connects to at least one of the set of signal wiring conductors. The electrically insulating substrate is singulated along a set of singulation lines to form the set of printed circuit boards. The singulation lines intersect with the plated through holes, so that a portion of the plated through holes is exposed along the peripheral edge of the resulting printed circuit boards.

13 Claims, 5 Drawing Sheets

METHOD OF FABRICATING PRINTED CIRCUIT BOARDS

BACKGROUND OF THE INVENTION

1. Field of the Invention

The present invention relates generally to a chip carrier and a method of manufacturing thereof. More specifically, the present invention relates to a chip carrier having terminals along its peripheral edge, and a method of manufacturing thereof.

2. Description of the Related Art

Printed circuit boards are commonly manufactured in various shapes and sizes dependent upon the environment and the apparatus for which they are intended. Printed circuit boards may be referred to as chip carriers. Such diversity of shape and size is difficult to handle and process in the commonly used automated equipment to screen print solder, to populate the printed circuit boards, and to solder the electronic components to the printed circuit boards.

For the automated equipment to be economically advantageous and useful for high volume processing of printed circuit boards, required items should be uniformly sized and shaped for their transport through the machinery. Accordingly, to accommodate this uniform size and shape necessity, panels of printed circuit board substrates thus are sized larger than the printed circuit boards themselves. These panels have a "frame" of scrap or excess material surrounding the printed circuit boards within the panels. A frame is used for handling the printed circuit boards during processing. Multiple circuit boards, typically identical boards, may be accommodated in varying shapes and quantities within each panel. These panels ultimately require trimming around the printed circuit boards to eliminate the waste or scrap frame surrounding them.

As a final finishing step, scrap or frame material surrounding the printed circuit boards has been removed from the printed circuit boards by usually one of two processes. One method uses a router to rout and remove material surrounding the edges of the printed circuit boards. A router is a device, which may be very simple or may be highly mechanized and automated. For example, in the device, a motor drives a rotary bit to cut substrate material for the printed circuit boards at the edge of the printed circuit boards. In this manner, the printed circuit boards are removed from the frame of scrap material between the printed circuit boards and the edge of the panels. Routers of this type may be numerically or computer controlled and typically are used in facilities manufacturing a large number of circuit boards. Routing has been the process used whenever the card shapes are other than "pure" rectangles. For example, the circuit boards may have protruding tabs for contact pads.

Routing a panel of printed circuit boards can consume several minutes. By reducing the routing time, a significantly higher number of panels can be processed by the router in the same period of time, significantly reducing the cost of the scrap separation step. The time consumed in the routing operation makes it an expensive step in printed circuit boards' production and a primary target for cost reduction.

A second process of excess or scrap material removal involves scoring the panels of the printed circuit boards to define the exterior boundaries of the printed circuit boards. This scoring weakens the scrap frame around the printed circuit boards to the point where they may be easily broken or snapped in a manual scrap removal operation. Scoring of the panel results in score lines being formed in one, or preferably both, faces of the printed circuit boards' panel. The scoring of the opposite faces of the panel may be accomplished by a machine that has two opposing rotary blades that cut into the surface of the printed circuit boards' panel. Rotating blades close from opposite directions onto the printed circuit boards; and, as the printed circuit boards are translated relative to the blades, a groove or score is cut into each of the opposing surfaces of the printed circuit boards' panel, leaving a thin web of material between the two opposing grooves or score lines.

The remaining web of material extends between the printed circuit boards and the scrap material surrounding printed circuit boards. Score lines typically extend in such a manner that they intersect at the corners of the printed circuit boards as well as extend across the frames of the scrap material. The score lines severely weaken the panel, as intended, but also affect the rigidity of the panels to the point that the panels may not be reliably handled by the automated processing equipment used on the panels. For example, with automated processing equipment used for solder screening, populating of a board with electronic circuit board elements, and the soldering of the elements to a circuit board may not reliably handle these types of panels. Semiconductor devices and integrated circuits, such as printed circuit boards in particular, are in widespread use in electrical and electronic devices of many types.

Regardless of application, however, electrical connections are made to other devices for semiconductor devices and integrated circuits to operate and to perform a useful function. At the same time, the mechanical environment of such electronic components provides mechanical protection and heat dissipation as well as supporting the integrity of electrical connections within, and to the exterior, of an electronic device package. Such connections have become increasingly complex and of fine connection pitch as integration density of integrated circuits has increased in response to demands for increased functionality and performance as well as potential manufacturing economy; often requiring more connections to and between chips and forming complex networks.

Chip carriers are used to wire out signals, power, grounds or other nets from a silicon die to interface with a motherboard. These chip carriers are also referred to as "substrates". Connections are often made on what is the bottom side of the substrate. For some silicon designs, more connections are required than the bottom side of the substrate allows, for a given connection pitch. While shrinking the connection pitch on the chip carrier may indeed provide more connections to the chip carrier, smaller connection pitches introduce other problems to the manufacturing of the chip carrier. Smaller connection pitches may result in poor socket contact or degrade connection reliability to unacceptable levels. These problems in turn result in a lower assembly yield and drive excessive cost for motherboard and printed circuit boards' fabrication.

BRIEF SUMMARY OF THE INVENTION

According to the illustrative embodiments, printed circuit boards, and a method of fabricating the printed circuit boards, are provided. An electrically insulating substrate is provided. The electrically insulating substrate includes a set of areas to be formed into a set of printed circuit boards. Each of the set of areas is separated from others of the set of areas by a dicing channel. A set of signal wiring conductors is fabricated onto the set of areas of the electrically insulating substrate so that at least one of the set of signal wiring conductors terminates proximate to the dicing channel. A set of plated through holes is fabricated through at least one of the set of areas such that at least one of the set of plated through holes connect to at least one of the set of signal wiring conductors. The electrically insulating substrate is singulated along a set of singulation lines to form the set of printed circuit boards. The singulation lines intersect with the plated through holes, so that a portion of the plated through holes is exposed along the peripheral edge of the resulting printed circuit boards.

DETAILED DESCRIPTION OF THE INVENTION

Figure 1:
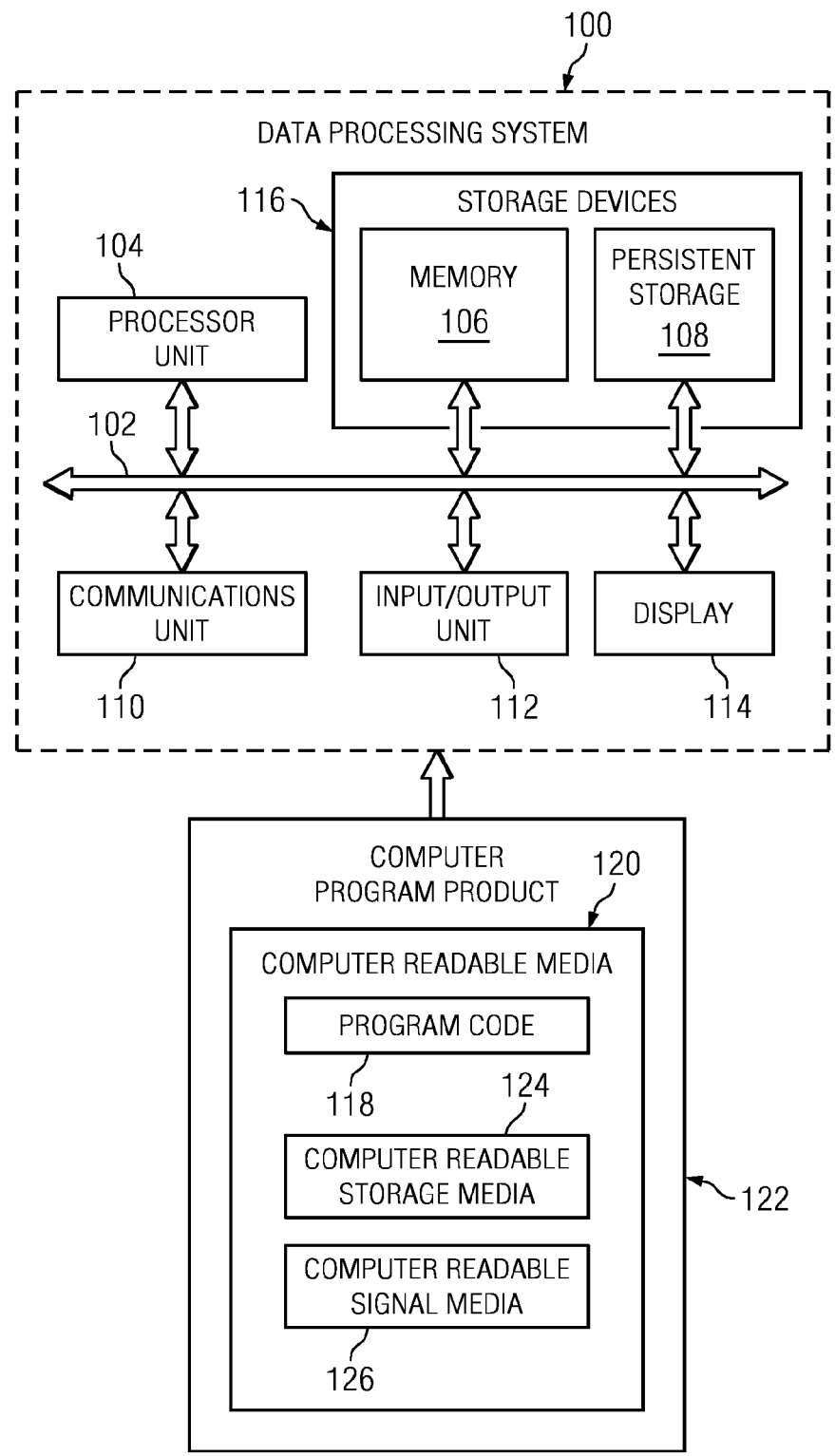
FIG. 1 is a diagram of a data processing system depicted in accordance with an illustrative embodiment.

With reference now to FIG. 1, a diagram of a data processing system is depicted in accordance with an illustrative embodiment. In this illustrative example, data processing system 100 includes communications fabric 102, which provides communications between processor unit 104, memory 106, persistent storage 108, communications unit 110, input/output (I/O) unit 112, and display 114.

Processor unit 104 serves to execute instructions for software that may be loaded into memory 106. Processor unit 104 may be a set of one or more processors or may be a multi-processor core, depending on the particular implementation. Further, processor unit 104 may be implemented using one or more heterogeneous processor systems, in which a main processor is present with secondary processors on a single chip. As another illustrative example, processor unit 104 may be a symmetric multi-processor system containing multiple processors of the same type.

Memory 106 and persistent storage 108 are examples of storage devices 116. A storage device is any piece of hardware that is capable of storing information, such as, for example, without limitation, data, program code in functional form, and/or other suitable information either on a temporary basis and/or a permanent basis. Memory 106, in these examples, may be, for example, a random access memory, or any other suitable volatile or non-volatile storage device. Persistent storage 108 may take various forms, depending on the particular implementation. For example, persistent storage 108 may contain one or more components or devices. For example, persistent storage 108 may be a hard drive, a flash memory, a rewritable optical disk, a rewritable magnetic tape, or some combination of the above.

The media used by persistent storage 108 may be removable. For example, a removable hard drive may be used for persistent storage 108.

Communications unit 110, in these examples, provides for communication with other data processing systems or devices. In these examples, communications unit 110 is a network interface card. Communications unit 110 may provide communications through the use of either or both physical and wireless communications links.

Input/output unit 112 allows for the input and output of data with other devices that may be connected to data processing system 100. For example, input/output unit 112 may provide a connection for user input through a keyboard, a mouse, and/or some other suitable input device. Further, input/output unit 112 may send output to a printer. Display 114 provides a mechanism to display information to a user.

Instructions for the operating system, applications, and/or programs may be located in storage devices 116, which are in communication with processor unit 104 through communications fabric 102. In these illustrative examples, the instructions are in a functional form on persistent storage 108. These instructions may be loaded into memory 106 for execution by processor unit 104. The processes of the different embodiments may be performed by processor unit 104 using computer implemented instructions, which may be located in a memory, such as memory 106.

These instructions are referred to as program code, computer usable program code, or computer readable program code that may be read and executed by a processor in processor unit 104. The program code, in the different embodiments, may be embodied on different physical or computer readable storage media, such as memory 106 or persistent storage 108.

Program code 118 is located in a functional form on computer readable media 120 that is selectively removable and may be loaded onto or transferred to data processing system 100 for execution by processor unit 104. Program code 118 and computer readable media 120 form computer program product 122. In one example, computer readable media 120 may be computer readable storage media 124 or computer readable signal media 126. Computer readable storage media 124 may include, for example, an optical or magnetic disc that is inserted or placed into a drive or other device that is part of persistent storage 108 for transfer onto a storage device, such as a hard drive, that is part of persistent storage 108. Computer readable storage media 124 also may take the form of a persistent storage, such as a hard drive, a thumb drive, or a flash memory that is connected to data processing system 100. In some instances, computer readable storage media 124 may not be removable from data processing system 100.

Alternatively, program code 118 may be transferred to data processing system 100 using computer readable signal media 126. Computer readable signal media 126 may be, for example, a propagated data signal containing program code 118. For example, computer readable signal media 126 may be an electromagnetic signal, an optical signal, and/or any other suitable type of signal. These signals may be transmitted over communications links, such as wireless communications links, an optical fiber cable, a coaxial cable, a wire, and/or any other suitable type of communications link. In other words, the communications link and/or the connection may be physical or wireless in the illustrative examples. The computer readable media also may take the form of non-tangible media, such as communications links or wireless transmissions containing the program code.

In some illustrative embodiments, program code 118 may be downloaded over a network to persistent storage 108 from another device or data processing system through computer readable signal media 126 for use within data processing system 100. For instance, program code stored in a computer readable storage media in a server data processing system may be downloaded over a network from the server to data processing system 100. The data processing system providing program code 118 may be a server computer, a client computer, or some other device capable of storing and transmitting program code 118.

The different components illustrated for data processing system 100 are not meant to provide architectural limitations to the manner in which different embodiments may be implemented. The different illustrative embodiments may be implemented in a data processing system including components in addition to or in place of those illustrated for data processing system 100. Other components shown in FIG. 1 can be varied from the illustrative examples shown. The different embodiments may be implemented using any hardware device or system capable of executing program code. As one example, data processing system 100 may include organic components integrated with inorganic components and/or may be comprised entirely of organic components excluding a human being. For example, a storage device may be comprised of an organic semiconductor.

As another example, a storage device in data processing system 100 is any hardware apparatus that may store data. Memory 106, persistent storage 108, and computer readable media 120 are examples of storage devices in a tangible form.

In another example, a bus system may be used to implement communications fabric 102 and may be comprised of one or more buses, such as a system bus or an input/output bus. Of course, the bus system may be implemented using any suitable type of architecture that provides for a transfer of data between different components or devices attached to the bus system. Additionally, a communications unit may include one or more devices used to transmit and receive data, such as a modem or a network adapter. Further, a memory may be, for example, memory 106 or a cache such as found in an interface and memory controller hub that may be present in communications fabric 102.

The illustrative embodiments provide printed circuit boards, and a method of fabricating the printed circuit boards. An electrically insulating substrate is provided. The electrically insulating substrate includes a set of areas to be formed into a set of printed circuit boards. Each of the set of areas is separated from others of the set of areas by a dicing channel. A set of signal wiring conductors is fabricated onto the set of areas of the electrically insulating substrate so that at least one of the set of signal wiring conductors terminates proximate to the dicing channel. A set of plated through holes is fabricated through at least one of the set of areas such that at least one of the set of plated through holes connect to at least one of the set of signal wiring conductors. The electrically insulating substrate is separated along a set of lines to form the set of printed circuit boards. These lines may be referred to as singulation lines. The singulation lines intersect with the plated through holes so that a portion of the plated through holes is exposed along the peripheral edge of the resulting printed circuit boards.

The illustrative embodiments provide additional connection density on the motherboard without sacrificing connection pitch. In current technology motherboard connections, the bottom side can only range from about 1 mm pitch to about 0.5 mm pitch or below, but decreasing pitch or increasing density drive a corresponding increase in the cost of motherboard fabrication. The illustrative embodiments described herein allow about 20 percent to about 30 percent more connections with the same body size substrate. This increase in connections may occur without increasing the connection density of the motherboard or socket on the bottom side and without sacrificing connection pitch.

The illustrative embodiments may be implemented, for example, without limitation, by designing a laminate substrate with connections between one or more silicon chips and one or more traditional printed circuit boards' bottom surface connections and one or more edge connections. The connections between chip and edge or bottom terminals is accomplished with industry standard metal wiring. The bottom surface connections are comprised of metal pads for a ball grid array (BGA) or land grid array (LGA). The edge connections are formed by routing connections from the chips to a number of plated through holes formed using drilling and plating techniques well known in the art. A number, when referring to items, means one or more items. For example, a number of plated through holes is one or more plated through holes.

Plated through holes may be placed for use as side terminals at the planned physical periphery of the laminate substrate. The copper edge or interior of the plated through holes is then exposed during substrate singulation from a larger panel.

Singulation can be performed using common industry methods, such as sawing, router cutting or equivalent methods. The exposed edge or interior of the plated through holes can then be used as a connection input, output, ground, or other nets to interface with a motherboard. The illustrative embodiments use the exposed metal connections, comprised of exposed plated through holes on the side of the laminate to increase the number of contacts without increasing the body size or bottom side density.

The processes, steps, and structures described below do not form a complete process flow for manufacturing integrated circuits. The different illustrative embodiments can be practiced in conjunction with integrated circuit fabrication techniques currently used in the art, and only so much of the commonly practiced process steps are included as necessary for an understanding of the illustrative embodiments. The figures in the illustrative examples represent cross sections of a portion of an integrated circuit during fabrication and are not drawn to scale, but instead are drawn so as to illustrate important features of the illustrative embodiments.

FIGS. 2A-2E depict the fabrication of a first embodiment of the multilayer printed circuit boards according to an illustrative embodiment.

Figure 2A:
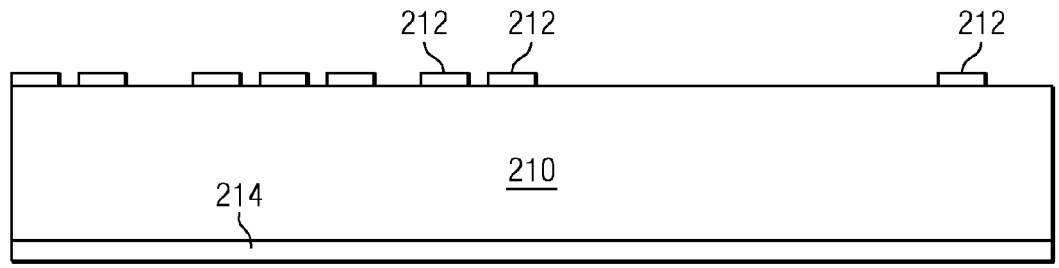
FIGS. 2A-2E depict the fabrication of a first embodiment of multilayer printed circuit boards according to an illustrative embodiment.

Referring now to FIG. 2A, there is shown an electrically insulating substrate 210. Electrically insulating substrate 210 is a base or supporting material to which additional layers or materials are applied. Electrically insulating substrate 210 is, for example, but not limited to, a glass epoxy substrate.

In these examples, signal wiring conductors 212 and 214 can be selectively deposited into a connection pattern by a dry-film dielectric with laser via process on selected surface portions of electrically insulating substrate 210, signal wiring conductors 212 and 214 are an electrically conductive material. This material may be, for example, but not limited to, copper, molybdenum, and tungsten. Each of the layers 212 and 214 has a weight of, for example, about 0.5 ounces and a thickness of, for example, about 18 micrometers.

Signal wiring conductors 212 and 214 can be patterned by direct selective deposition, selective etching, or other suitable techniques. Signal wiring conductor 214 on the other side can be utilized as a power supply layer. However, it should be clear to those skilled in the art, that signal wiring conductor 214 can also be patterned and segmented into a power mesh with signal pads distributed within the power mesh, but not necessarily connected to the power mesh.

Figure 2B:
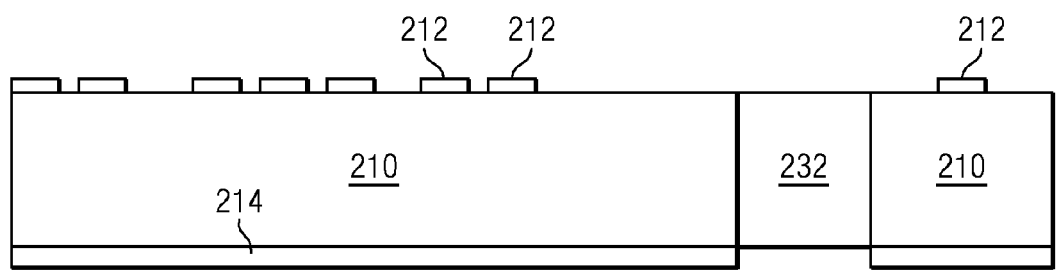

As shown in FIG. 2B, a through hole 232 is formed at a location where a connection is to be established. Although only one through hole 232 is shown in FIG. 2B, a plurality of through holes may be provided as required. Through hole 232 may be formed by mechanical drilling or otherwise machining or ablating electrically insulating substrate 210.

While through hole 232 is shown as being formed early in the fabrication process, it is appreciated that through hole 232 can be similarly fabricated at other points during fabrication of a printed circuit boards. Through hole 232 can be formed, for example, but not limited to, prior to deposition of any signal wiring connectors, after deposition of signal wiring connectors, and at any other point during the build up of various layers of the printed circuit boards.

Figure 2C:
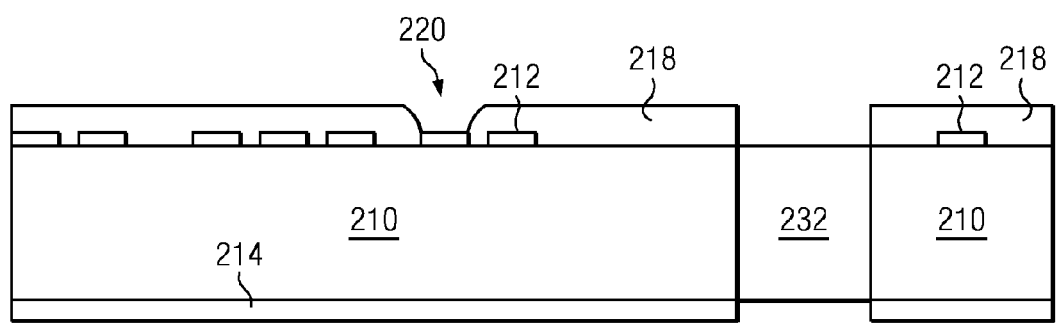

Next, in FIG. 2C, layer 218 of electrically insulating material, preferably a layer of photosensitive resin, is applied to cover the signal wiring conductors 212 in the first wiring layer, and the photosensitive resin is then exposed and developed to form via holes 220 at selected locations. The photosensitive resin can be a negative type photosensitive epoxy resin applied to the surface of the substrate by curtain coating, and then precured. The photosensitive resin is then developed with a developer. This developer may be, for example, a mixture of propylene carbonate, cyclohexanone, and gamma-butyrolactone.

After being developed, the surface of the epoxy resin layer 218 is roughened by etching with a solution of potassium permanganate, and was then activated with a seeding chemical. This seeding chemical is a solution including colloidal tin and palladium in this illustrative example.

Figure 2D:
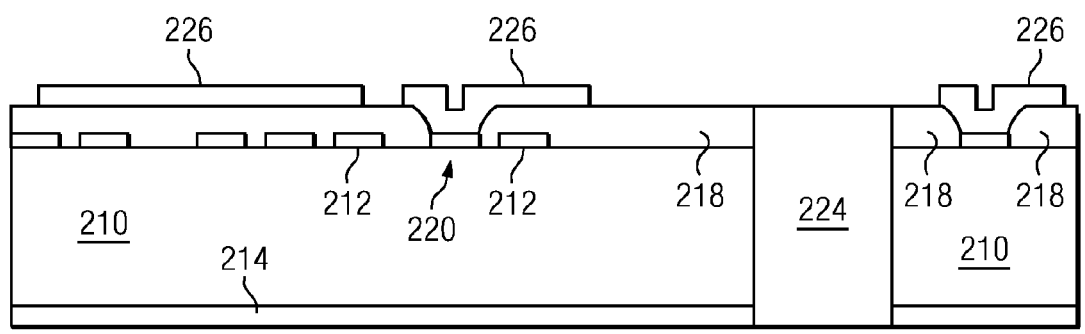

As shown in FIG. 2D, signal wiring conductors 226 of an electrically conductive material of a second level is selectively deposited by a dry-film dielectric with laser via process into a connection pattern on selected surface portions of the insulating layer formed with via holes. The electrically conductive material may be, for example, copper. Signal wiring conductors 226 of the second level is connected to the signal wiring conductors 212 of the first level by plated via holes 224.

It is appreciated that signal wiring conductors 226 can be patterned by other methods known in the art, such as for example, by a dry-film dielectric with laser via process by selective etching to form a second wiring layer or wiring level which includes signal wiring conductors 226. Additional layers may be added to one or both sides of the circuit board in subsequent steps not shown here.

Figure 2E:
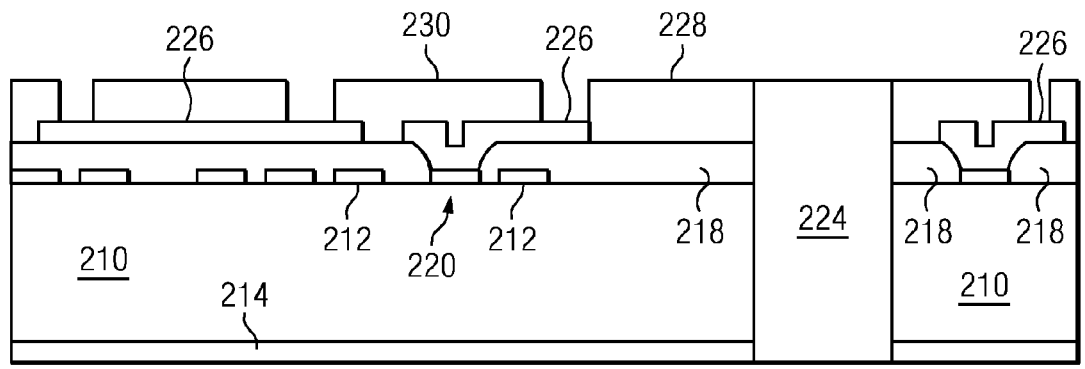

As shown in FIG. 2E, in the same manner as the step shown in FIG. 2C, a second photosensitive resin insulating layer 228 is applied on the signal wiring conductors 226 in the second level, and via holes 230 are formed at selected locations by exposure and development.

Figure 3:
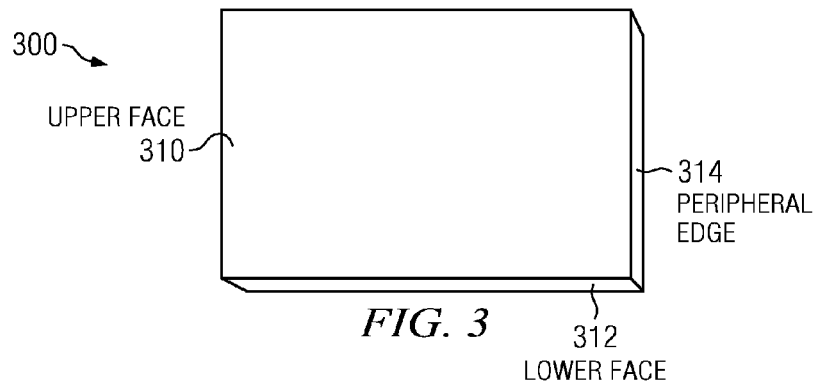
FIG. 3 is an isometric view of a printed circuit boards shown according to an illustrative embodiment.

Referring now to FIG. 3, an isometric view of a printed circuit board is shown according to an illustrative embodiment. Printed circuit board 300 is a board fabricated according to the process of steps 2A-2E.

Printed circuit board 300 includes upper face 310, lower face 312, and peripheral edge 314. Signal wiring conductors, such as signal wiring conductors 216 of FIG. 2 can have a connection termination at upper face 310, lower face 312, or along peripheral edge 314.

Figure 4:
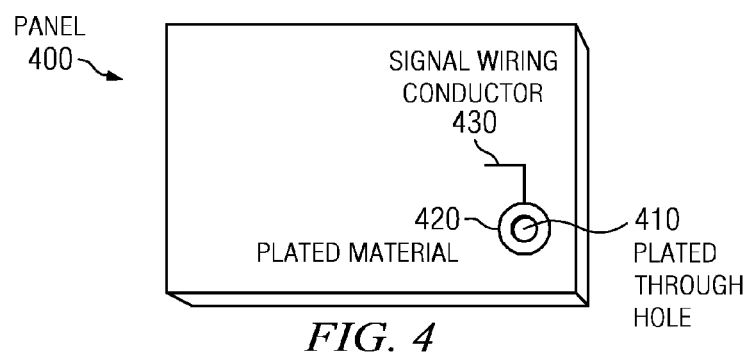
FIG. 4 is a plated through hole shown according to an illustrative embodiment.

Referring now to FIG. 4, a plated through hole is shown according to an illustrative embodiment. Plated through holes, such as plated through hole 410 are generally provided in to panel 400. Panel 400 can be fabricated into a printed circuit board, such as the board fabricated in FIGS. 2A-2E, for conveying electrical current between the connected terminals on opposite sides of a substrate of the electronic components. Plated through hole 410 allows a signal to be conducted from one side of a printed circuit boards to the other side of the printed circuit boards, and for other distinct plated through holes to supply power from the power mesh or plane 214, to supply various power connections to the top side of panel 400. Plated through hole 410 is generally created by plating copper or some other metal onto the side walls of the through holes that have been drilled through the circuit board. Through holes are drilled where desired through the substrate. Afterwards, the holes are then cleaned to remove residue present from the drilling. Plated through hole 410 can be plated to the desired thickness by electroplating from a typical electroplating copper bath. Plated material 420 provides a conduit for conveying electrical current through the printed circuit boards between the connected terminals.

Connected to plated through holes 410 is at least one signal wiring conductor 430. Signal wiring conductor 430 can be signal wiring conductors 216 of FIG. 2.

Figure 5:
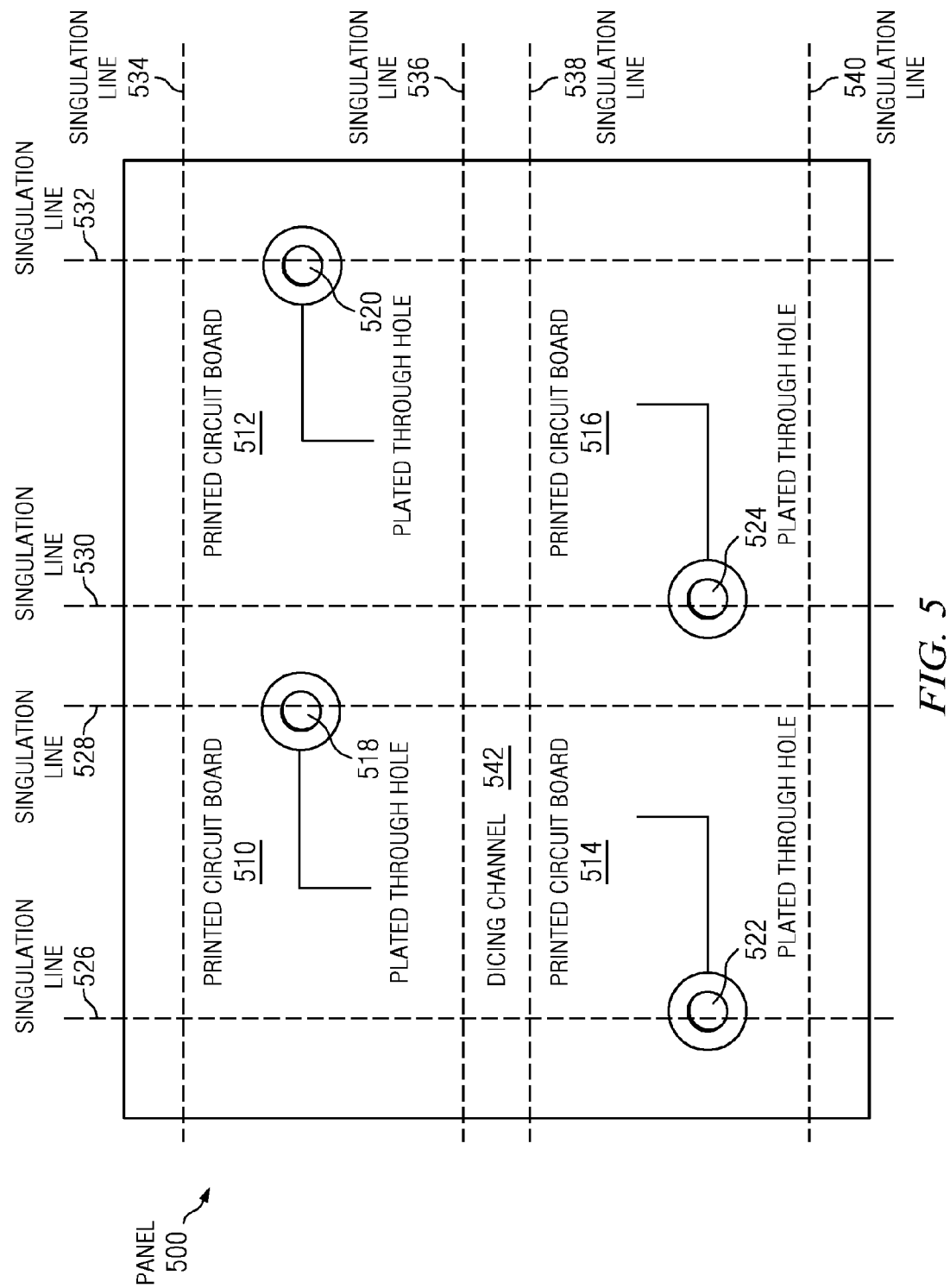
FIG. 5 is an isometric view of a panel for fabrication of individual printed circuit boards according to an illustrative embodiment.

Referring now to FIG. 5, an isometric view of a panel for fabrication of individual printed circuit boards is shown according to an illustrative embodiment. Panel 500 can be the multilayer printed circuit boards created in FIGS. 2A-2E.

Panel 500 incorporates printed circuit boards 510-516 into a "four up pattern". Each of printed circuit boards 510-516 is a printed circuit board, such as printed circuit board 300 of FIG. 3.

Plated through holes 518-524 are fabricated into printed circuit boards 510-516. Plated through holes 518-524 are plated through holes, such as plated through hole 410 of FIG. 4. Plated through holes 518-524 are generally created by plating copper or some other metal onto the side walls of through holes that have been drilled through printed circuit boards 510-516. While individual electronic components, conductors and contact pads are not illustrated in FIG. 5 for simplicity of illustration, conductors, contact pads and components may be positioned thereon and soldered.

Separation of panel 500 into printed circuit boards 510-516 occurs along singulation lines 526-540. Singulation lines 526-540 can be scored, perforated, or otherwise indicated on panel 500. Singulation lines 526-540 can also be unindicated on panel 500, instead relying on positioning of panel 500 to ensure correct geometry for singulation of printed circuit boards 510-516.

Separating each of printed circuit boards 510-516, and surrounding the edge of panel 500 is dicing channel 542. Dicing channel 542, also known as a kerf or saw-street, is that expendable portion of panel 500 that is discarded after singulation. Machinery, such as a router, saw, water injection, laser or other device that is used to singulate printed circuit boards 510-516 from panel 510 will produce a worked cut of some diameter in panel 510. This diameter is extended into dicing channel 542 such that the singulation process does not destroy circuitry on printed circuit boards 510-516.

Plated through holes 518-524 are positioned within printed circuit boards 510-516 such that singulation will cause a portion of the plated through-hole to be exposed along the peripheral edge of printed circuit boards 510-516. Singulation can remove portions of panel 500 such that the exposed portion of the plated through hole can be an exterior edge of the plated through hole. Conversely, singulation can remove portions of panel 500 and an arcuate section of the plated through holes such that the exposed portion of the plated through hole can be an interior portion of the plated through hole. The exposed edge or interior of the plated through holes can then be used as a connection input, output, ground, or other signal nets to interface with a motherboard.

In an illustrative embodiment, the exposed portion of the plated through hole forms a peripheral edge input to the printed circuit boards and is utilized as a connection point for electrical test. When utilized as a connection point for electrical test, these peripheral input points would be testable to the manufacturer, but not interface with the client device.

Figure 6:
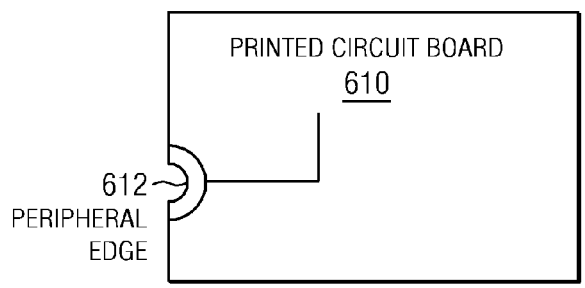
FIG. 6 is a printed circuit boards having inputs along a peripheral edge according to an illustrative embodiment.

Referring now to FIG. 6, printed circuit boards having inputs along a peripheral edge is shown according to an illustrative embodiment. Printed circuit board 610 can be printed circuit boards such as one of printed circuit boards 510-516 of FIG. 5.

Printed circuit board 610 includes peripheral edge input 612. Peripheral edge input 612 is formed by exposing a portion of a plated through hole, such as one of plated through holes 518-524 during singulation of printed circuit board 610. Singulation can remove portions of a panel surrounding printed circuit board 610 such that the exposed portion of the plated through-hole forming peripheral edge input 612 can be an exterior edge of the plated through hole. Conversely, singulation can remove portions of a panel surrounding printed circuit board 610 and an arcuate section of the plated through holes such that the exposed portion of the plated through hole forming peripheral edge input 612 can be an interior portion of the plated through hole. The exposed edge or interior of the plated through holes peripheral edge input 612 can then be used as a connection input, output, ground, or other signal nets to interface with a motherboard.

Figure 7:
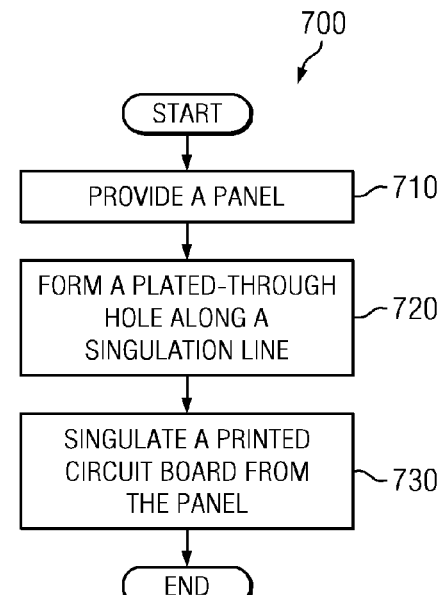
FIG. 7 is a flowchart of a method for fabricating a printed circuit boards having inputs along a peripheral edge according to an illustrative embodiment.

Referring now to FIG. 7, a singulated, printed circuit board having inputs along a peripheral edge is shown according to an illustrative embodiment.

Process 700 begins by providing a printed circuit board, or chip carrier (step 710). The printed circuit board, or chip carrier can be, for example, but not limited to, panel 400 of FIG. 4. The panel can be manufactured according to known processes. The panel can be, for example, but not limited to, multiple layers of electrical wiring layers embedded or patterned on organic or ceramic dielectric layers.

Process 700 begins by providing a panel (step 710), such as panel 400 of FIG. 4. The panel incorporates several printed circuit boards that can be singulated into individual boards.

Process 700 continues by forming a plated through hole along a singulation line of the printed circuit boards of the panel (step 720). The plated through hole can be a through hole, such as plated through hole 410 of FIG. 4, plated with a plating material such as plated material 420 of FIG. 4. Connected to plated through holes 410 is at least one signal wiring conductor 430. Signal wiring conductor 430 can be signal wiring conductors 216 of FIG. 2

Process 700 then singulates a printed circuit board from the panel exposing a portion of the plated through hole along the peripheral edge of the printed circuit boards (step 730). Singulation can remove portions of the panel such that the exposed portion of the plated through hole can be an exterior edge of the plated through hole. Conversely, singulation can remove portions of the panel and an arcuate section of the plated through holes such that the exposed portion of the plated through hole can be an interior portion of the plated through hole.

The illustrative embodiments provide printed circuit boards, and a method of fabricating the printed circuit boards. An electrically insulating substrate is provided. The electrically insulating substrate includes a set of areas to be formed into a set of printed circuit boards. Each of the set of areas is separated from others of the set of areas by a dicing channel. A set of signal wiring conductors is fabricated onto the set of areas of the electrically insulating substrate so that at least one of the set of signal wiring conductors terminates proximate to the dicing channel. A set of plated through holes is fabricated through at least one of the set of areas such that at least one of the set of plated through holes connects to at least one of the set of signal wiring conductors. The electrically insulating substrate is singulated along a set of singulation lines to form the set of printed circuit boards. The singulation lines intersect with the plated through holes, so that a portion of the plated through holes is exposed along the peripheral edge of the resulting printed circuit boards.

The illustrative embodiments provide additional connection density on the motherboard without sacrificing connection pitch. In current technology, motherboard connections on the bottom side can only range from over 1 mm pitch to 0.5 mm pitch or below, but decreasing pitch or increasing density drive a corresponding increase in the cost of motherboard fabrication. The illustrative embodiments described herein allow 20-30% more connections with the same body size substrate, without increasing the connection density of the motherboard or socket on the bottom surface, and without sacrificing connection pitch.

The illustrative embodiments are implemented by designing a laminate substrate with connections between one or more silicon chips and one or more traditional printed circuit boards' bottom surface connections and one or more edge connections. The connections between chip and edge or bottom terminals are accomplished with industry standard metal wiring. The bottom surface connections are comprised of metal pads for a Ball Grid Array (BGA) or Land Grid Array (LGA). The edge connections are formed by routing connections from the chips to a plated through hole (plated through holes) using drilling and plating techniques.

The design places plated through holes to be used as side terminals at the planned physical periphery of the laminate substrate. The copper edge, or interior of the plated through holes is then exposed during substrate singulation from a larger panel. Singulation can be performed using common industry method, such as sawing, router cutting or equivalent methods. The exposed edge or interior of the plated through holes can then be used as a connection input, output, ground, or other signal nets to interface with a motherboard. The illustrative embodiments use the exposed metal connections, comprised of exposed plated through holes on the side of the laminate to increase the number of contacts without increasing the body size or bottom side density.

The flowchart and block diagrams in the figures illustrate the architecture, functionality, and operation of possible implementations of systems, methods and related computer products according to various illustrative embodiments. In this regard, each block in the flowchart or block diagrams may represent a module, chip-carrier, which comprises one or more elements for implementing the specified function(s) of computer system hardware. It should also be noted that, in some alternative implementations, the functions noted in the block may occur out of the order noted in the figures. For example, two blocks shown in succession may, in fact, be executed substantially concurrently, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts.

The terminology used herein is for the purpose of describing particular embodiments only and is not intended to be limiting of the different illustrative embodiments. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed.

The description of the illustrative embodiments has been presented for purposes of illustration and description, and is not intended to be exhaustive or limited to the embodiment in the form disclosed. Many modifications and variations will be apparent to those of ordinary skill in the art. The different illustrative embodiments were chosen and described in order to best explain the principles of the invention, the practical application, and to enable others of ordinary skill in the art to understand the invention for various embodiments with various modifications as are suited to the particular use contemplated.

What is claimed is:

1. A method of fabricating printed circuit boards, the method comprising:
   fabricating a set of signal wiring conductors onto a set of areas of an electrically insulating substrate such that a number of the set of signal wiring conductors terminates proximate to a dicing channel separating each of the set of areas from others of the set of areas in which the set of areas are to be formed into a set of printed circuit boards;
   fabricating a set of plated through holes through a number of the of the set of areas such that a number of the set of plated through holes connects to the number of the set of signal wiring conductors; and
   separating the set of areas in the electrically insulating substrate along a set of singulation lines to form the set of printed circuit boards, wherein a number of the set of singulation lines intersects with the number of the set of plated through holes to expose an exterior edge of the number of the set of plated through holes during singulation.

2. The method of claim 1, further comprising:
   utilizing the exterior edge of the number of the set of plated through holes exposed during the singulation as one of a connection input, output, ground, or signal net to interface with a motherboard.

3. The method of claim 1, further comprising:
   utilizing the exterior edge of the number of the set of plated through holes exposed during the singulation as a connection point for electrical test.

4. The method of claim 1, wherein the separating of the set of areas in the electrically insulating substrate along the set of singulation lines to form the set of printed circuit boards further comprises:
   separating the electrically insulating substrate along the set of singulation lines to form the set of printed circuit boards, wherein the exterior edge of the number of the set of plated through holes defines a connection termination along a peripheral edge of the set of printed circuit boards.

5. The method of claim 1, further comprising:
   fabricating an additional set of signal wiring conductors and an additional electrically insulating substrate onto the electrically insulating substrate.

6. The method of claim 1, wherein the separating of the electrically insulating substrate along the set of singulation lines to form the set of printed circuit boards further comprises:
   separating the electrically insulating substrate along the set of singulation lines to form the set of printed circuit boards, wherein the singulation is performed by a process chosen from a group consisting of routing singulation, sawing singulation, water injection singulation, laser singulation, and combinations thereof.

7. The method of claim 1, wherein the fabricating of the set of plated through holes through the number of the set of areas further comprises:
   fabricating the set of plated through holes through the number of the set of areas such that at least one of the set of plated through holes connect to at least one of the set of signal wiring conductors, wherein the fabrication is performed using a copper, molybdenum, or tungsten electroplating process.

8. A method of fabricating a panel, the method comprising:
   providing an electrically insulating substrate, the electrically insulating substrate comprising a set of areas to be formed into a set of printed circuit boards, wherein each of the set of areas are separated from others of the set of areas by a dicing channel;
   fabricating a set of signal wiring conductors onto the set of areas of the electrically insulating substrate so that at least one of the set of signal wiring conductors terminates proximate to the dicing channel; and
   fabricating a set of plated through holes through at least one of the set of areas such that at least one of the set of plated through holes connects to at least one of the set of signal wiring conductors, wherein at least one planned singulation line intersects with the at least one of the set of plated through holes to expose an exterior edge of the at least one of the set of plated through holes during singulation.

9. The method of claim 8, further comprising:
   utilizing the exterior edge of the at least one of the set of plated through holes exposed during the singulation as a connection input, output, ground, or signal net to interface with a motherboard.

10. The method of claim 8, further comprising:
    singulating the electrically insulating substrate along a set of singulation lines to form the set of printed circuit boards, wherein the exterior edge of the at least one of the set of plated through holes defines a connection termination along a peripheral edge of the set of printed circuit boards.

11. The method of claim 8, further comprising:
fabricating an additional set of signal wiring conductors and an additional electrically insulating substrate onto the electrically insulating substrate.

12. The method of claim 8, wherein the fabricating of the set of plated through holes through the at least one of the set of areas further comprises:
fabricating the set of plated through holes through the at least one of the set of areas such that the at least one of the set of plated through holes connect to the at least one of the set of signal wiring conductors, wherein the fabrication is performed at least in part using a copper electroplating process, a molybdenum electroplating process, or a tungsten electroplating process.

13. The method of claim 8, wherein the fabricating of the set of plated through holes through the at least one of the set of areas further comprises:
fabricating the set of plated through holes through the at least one of the set of areas such that the at least one of the set of plated through holes connect to the at least one of the set of signal wiring conductors, wherein the fabrication is performed at least in part using a laser ablation process.

* * * * *